United States Patent
Gidwani et al.

(12) 
(10) Patent No.: US 8,963,167 B2
(45) Date of Patent: *Feb. 24, 2015

(54) DIODE ENERGY CONVERTER FOR CHEMICAL KINETIC ELECTRON ENERGY TRANSFER

(71) Applicant: NeoKismet, LLC, San Francisco, CA (US)

(72) Inventors: Jawahar M. Gidwani, San Francisco, CA (US); Anthony C. Zuppero, Pollock Pines, CA (US)

(73) Assignee: Neokismet, LLC, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/165,492

(22) Filed: Jan. 27, 2014

(65) Prior Publication Data

US 2014/0130852 A1    May 15, 2014

Related U.S. Application Data

(60) Continuation of application No. 13/336,529, filed on Dec. 23, 2011, now Pat. No. 8,637,339, which is a division of application No. 12/029,565, filed on Feb. 12, 2008, now Pat. No. 8,476,095, which is a division of application No. 10/759,341, filed on Jan. 16, 2004, now Pat. No. 7,371,962, which is a continuation-in-part of application No. 10/038,257, filed on Oct. 24, 2001, now Pat. No. 6,700,056, which is a continuation of application No. 09/589,669, filed on Jun. 7, 2000, now Pat. No. 6,327,859, which is a division of application No. 09/304,979, filed on May 4, 1999, now Pat. No. 6,114,620.

(51) Int. Cl.
| | |
|---|---|
| *H01L 21/00* | (2006.01) |
| *H01L 21/12* | (2006.01) |
| *H01L 21/26* | (2006.01) |
| *H02N 11/00* | (2006.01) |
| *H01L 29/66* | (2006.01) |
| *H02S 10/00* | (2014.01) |
| *H02N 2/18* | (2006.01) |

(52) U.S. Cl.
CPC .............. *H02N 11/002* (2013.01); *H01L 29/66* (2013.01); *H02N 6/00* (2013.01); *H02N 2/18* (2013.01); *Y10S 136/291* (2013.01)
USPC ............... 257/79; 257/85; 257/183; 257/471; 257/E21.046; 257/E21.062; 257/E21.352; 136/291

(58) Field of Classification Search
None
See application file for complete search history.

(56) References Cited

U.S. PATENT DOCUMENTS

| | | | |
|---|---|---|---|
| 2002/0121088 A1* | 9/2002 | Zuppero et al. | 60/532 |
| 2002/0123592 A1* | 9/2002 | Zhang et al. | 528/10 |

* cited by examiner

*Primary Examiner* — Mohsen Ahmadi
(74) *Attorney, Agent, or Firm* — Dickstein Shapiro LLP

(57) ABSTRACT

An improved diode energy converter for chemical kinetic electron energy transfer is formed using nanostructures and includes identifiable regions associated with chemical reactions isolated chemically from other regions in the converter, a region associated with an area that forms energy barriers of the desired height, a region associated with tailoring the boundary between semiconductor material and metal materials so that the junction does not tear apart, and a region associated with removing heat from the semiconductor.

20 Claims, 4 Drawing Sheets

US 8,963,167 B2

DIODE ENERGY CONVERTER FOR CHEMICAL KINETIC ELECTRON ENERGY TRANSFER

REFERENCE TO CROSS-RELATED APPLICATIONS

This is a continuation application of U.S. application Ser. No. 13/336,529, filed Dec. 23, 2011, now U.S. Pat. No. 8,637,339 which is a divisional application of U.S. patent application Ser. No. 12/029,565, filed Feb. 12, 2008, now U.S. Pat. No. 8,476,095, which is a divisional application of U.S. patent application Ser. No. 10/759,341, filed Jan. 16, 2004, now U.S. Pat. No. 7,371,962, which is a continuation-in-part application of U.S. patent application Ser. No. 10/038,257, filed Oct. 24, 2001, now U.S. Pat. No. 6,700,056, which is a continuation of U.S. patent application Ser. No. 09/589,669 filed Jun. 7, 2000 now U.S. Pat. No. 6,327,859, which is a divisional of U.S. patent application Ser. No. 09/304,979 filed May 4, 1999 now U.S. Pat. No. 6,114,620.

FIELD OF THE INVENTION

The present invention relates to the extraction of electrical or mechanical energy or coherent radiation from chemical reactions occurring on the surface of a catalyst before thermal equilibrium has been reached by the forms of the released energy.

BACKGROUND

Recent experimental observations have revealed clues to various catalytic processes occurring: 1) during the 0.01 picosecond time interval during which chemical reactants form bonds with the surface of a catalyst, causing the emission of charge carriers, such as electrons and holes; 2) during the picosecond time interval during which reactants adsorb and lose energy in quantum steps after becoming trapped at a potential well between an adsorbate and a catalyst surface, producing electronic friction, charge carrier currents and phonon emission; and 3) during the nanosecond and longer time intervals during which reaction intermediates and products radiate electromagnetic energy, either while trapped on a catalyst surface or immediately after escaping it. These processes entail three energy releasing processes, namely: 1) charge carrier emission (electrons and holes), 2) phonon emission and 3) photon emission.

The discovery of these pre-equilibrium emissions provides new pathways to convert the high grade chemical energy available during pre-equilibrium phases into useful work. The term "preequilibrium" refers to the period, however brief, during which the products of reactions have not yet come to thermal equilibrium. These products include energy emissions, such as charge carriers; high frequency phonons normally associated with the optical branch lattice vibrations and with acoustic branch vibrations of similar wavelength and energy; and excited state chemical product species.

Prior to the discovery of these rapid energy emission pathways, the energies resulting from a catalytic process, such as the heat of adsorption and the heat of formation, were considered to be heat associated with an equilibrium condition. Indeed, after tens of femtoseconds, emitted charge carriers have thermalized and after a few to hundreds of picoseconds, emitted phonons have thermalized.

SUMMARY

In an exemplary embodiment of the present invention, the emissions of charge carriers, such as electron-hole pairs, generated by chemical activity and reactions on or within catalyst surfaces, clusters or nanoclusters, are converted into electric potential. In an exemplary embodiment, semiconductor diodes such as p-n junctions and Schottky diodes formed between the catalyst and the semiconductors are used to carry out the conversion. The diodes are designed to collect ballistic charge carriers and can be Schottky diodes, pn junction diodes or diodes formed by various combinations of metal-semiconductoroxide structures. The interlayer oxide thickness is preferably less than the particular ballistic mean free path associated with the energy loss of the appropriate charge carrier (e.g., hole or electron). The diodes are placed in contact with or near the catalyst nanolayer or nanocluster within a distance whose order of magnitude is less than approximately the mean free path of the appropriate ballistic charge carrier originating in the catalyst. In one embodiment, the diode is located adjacent to the catalyst cluster, while in a further embodiment, the diode is located under the catalyst, as a substrate.

The charge carriers travel ballistically over distances that can exceed the width of appropriately fabricated semiconductor junctions, similar to a thermionic effect. However, unlike the thermionic effect, the charge carriers in the case of the present invention need not have energy greater than the work function of the material involved. The charge carrier motion is trapped as a difference in fermi level, or chemical potential, between either side of the junction. The resulting voltage difference is indistinguishable from that of a photovoltaic collector. However, the charge carrier forces itself into the valence or conduction band and the circuit provides a counterpart hole or electron.

The present invention also provides devices and methods for converting the energy generated by catalytic reactions to mechanical motion before the energy thermalizes. In an exemplary embodiment, the converted motion is used to move a hydraulic fluid against a resisting pressure.

Recent advances in the art of quantum wells, atomically smooth superlattices and nanometer scale fabrication permit a degree of tailoring of the physical parameters to favor a particular reaction pathway (charge carrier, phonon, photon) or to enhance the efficiency of the energy collector.

The temperature of operation of a device in accordance with the present invention can be as low as hundreds of degrees Kelvin, which is much lower than the typical operational temperatures of conventional thermophotovoltaics and thermionic systems (1500 to 2500 Kelvin). Moreover, the power per mass and power per volume ultimately achievable using pre-equilibrium emissions in accordance with the present invention exceeds that of fuel cells, conventional thermo-photovoltaics, and conventional thermionic systems.

Furthermore, in comparison to fuel cells which require complex ducting, the devices of the present invention allow mixing of fuel and air in the same duct, thereby simplifying ducting requirements.

The combination of high volume and mass power density, simplicity, and lower temperature operation makes the methods and devices of the present invention competitive and uniquely useful.

DETAILED DESCRIPTION

Figure 1:
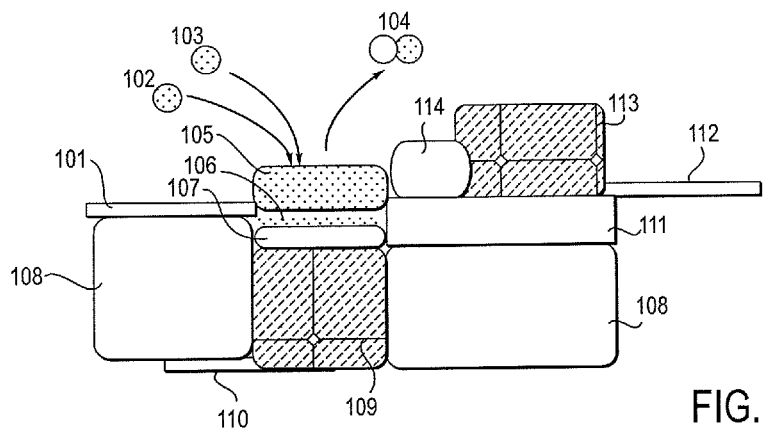
FIG. 1. shows a cross-section of an exemplary embodiment of a device for generating electricity in accordance with the present invention.

FIG. 1 shows a cross-sectional view of an exemplary embodiment of a device in accordance with the present invention. The device of FIG. 1, includes a catalyst 105 which is arranged on a top surface of the device to come into contact with oxidizer molecules 103 and fuel molecules 102. In the exemplary embodiment of FIG. 1, the catalyst 105 can be comprised of platinum or palladium, the oxidizer 103 can be comprised of air and the fuel 102 can be comprised of hydrogen or a reactant hydrocarbon such as methanol or ethanol. Exhaust molecules 104 result from the catalyzed reaction.

The exemplary device of FIG. 1 comprises a pair of Schottky diodes which act as charge carrier collectors, with one diode 113 being arranged on the top surface of the device, adjacent to the catalyst 105 (the "adjacent surface diode") and the other diode 109 being arranged in the substrate 108, below the catalyst (the "substrate diode"). An insulating layer 111 is arranged between the adjacent surface diode 113 and the substrate 108, as shown. The diodes 109 and 113 preferably comprise a bipolar semiconductor material such as InGaAsSb with a composition chosen to optimize the chosen operating conditions. For example, the second harmonic of a CO stretch vibration on a catalyst surface at 2340 per cm energies gives a photon energy of 0.58 eV. (This matches the 0.53 eV band gap of a recently developed InGaAsSb diode described in G. W. Charache et al., "InGaAsSb thermophotovoltaic diode: Physics evaluation," Journal of Applied Physics, Vol. 85, No. 4, February 1999). he diodes 109 and 113 preferably have relatively low barrier heights, such as 0.05 to 0.4 volts.

The substrate diode 109 should be forward biased sufficiently (e.g., up to 3 volts) to raise its conduction and valence bands above the fermi level of the catalyst 105 so as to match the energy levels of the adsorbed reactants on the catalyst surface, such as oxygen or hydrocarbon free radicals. This induces resonant tunneling of energy into the substrate diode 109 by photonshe dimension of the oxide barrier or the depletion region should be kept to less than the ballistic transport dimension, which is on the order of 10 nanometers.

A metal such as Mg, Sb, Al, Ag, Sn Cu or Ni may be used to form an interlayer 106 between the catalyst 105 and the semiconductor of the substrate diode 109. The interlayer 106 serves to provide a lattice parameter match between the catalyst material and the substrate, which in turn provides a smooth and planar interface surface with which to construct a quantum well structure consisting of the catalyst, the vacuum above and the interlayer below. A quantum well structure with smooth interfaces alters the density of electron states in the directions toward the substrate and toward the vacuum, so as to enhance the number of electrons with the desired energy. The thickness of the catalyst and the interlayer should be small enough to permit ballistic transport of charge carriers. This dimension is typically less than 20 nanometers. Quantum well structures with thickness less than 0.5 nanometer are possible in the present state of the art. The quantum well structure may be constructed as an island, like a pancake on a surface (also referred to as a "quantum dot").

The device of FIG. 1 may also include a non-conducting layer 107 arranged between the substrate diode 109 and the catalyst 105. The layer 107, which can be comprised of an oxide, permits forward-biasing of the diode 109 without a significant increase in the forward current. The layer 107 provides a barrier against such forward current. An optional oxide 114 barrier may also be arranged on the surface of the device between the catalyst 105 and the surface diode 113.

Electrical contacts 101, 110 and 112 are arranged as shown in FIG. 1. Contacts 101 and 110 serve as electrical output leads for the substrate diode. Contacts 101 and 112 are the electrical output leads for the surface diode.

In the device of FIG. 1, the catalyst layer 105 may comprise a quantum well structure (including quantum dots) having a thickness typically less than 20 nm and being sufficiently small so as to alter the density of electron states in the catalyst to favor the production of substantially monoenergetic holes or electrons. The substrate diode 109 and the catalyst 105 may be separated by an interlayer 106 of metal that permits matching the lattice parameters of the catalyst to this interlayer. The catalyst 105 and interlayer 106 comprise the quantum well. The interlayer 106 must be sufficiently thin so as to permit non-energy changing electron transport into the diode. The thickness of the interlayer 106 should be preferably less than 20 nanometers.

In an exemplary embodiment of a device in accordance with the present invention, the substrate diode 109 comprises an n-type direct band gap semiconductor with a band gap chosen to favor the emission of energetic electrons.

In a further exemplary embodiment, the thickness or cluster size (if arranged in clusters) of the catalyst layer 105 is sufficiently small so as to permit the appearance of band gaps, discrete electron states and catalyst properties unlike the same material in bulk. In this case, the catalyst 105 can be comprised, preferably, of gold, silver, copper, or nickel and be arranged as monolayer, 200 atom clusters.

Figure 2:
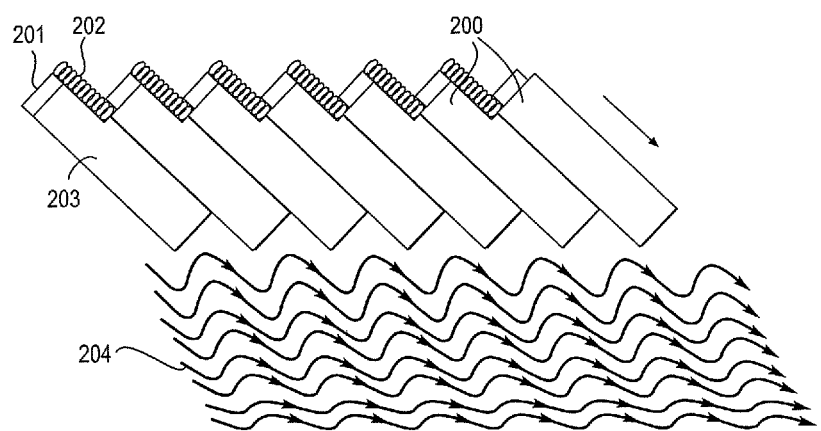
FIG. 2 shows a cross-section of an exemplary embodiment of a device for converting the energy released by a catalytic reaction into mechanical work.

FIG. 2 shows an exemplary embodiment of a device in accordance with the present invention in which the emissions of phonons generated by adsorbing and bonding reactions on or within catalyst surfaces, clusters or nano-structures are converted into hydraulic fluid pressure.

In accordance with the present invention, pressures generated by phonons directed into a catalyst body on a first side of the catalyst body form a phonon wave which can be guided by the geometry of the catalyst (or substrate upon which the catalyst may be situated) so that the phonons travel to the other side of the substrate and impart a pressure onto a fluid. The thickness of this travel should be less than the mean distance over which the direction of the phonon remains substantially unperturbed. The phonons arrive at an angle (a "grazing" angle) such that the directional and asymmetric pressure of the arriving phonons appears as wave motion on the other side of the catalyst body which pushes against a fluid such as a liquid metal or sacrificial interface, causing it to move in a direction parallel to the bottom surface. An apparent negative coefficient of friction between the wall and the fluid is exhibited due to the wave motion or directed impulses along the surface of the bottom of the device.

The exemplary device comprises a substrate 202 with top and bottom surfaces having a saw-tooth pattern, as shown in the cross-sectional view of FIG. 2. The bottom surface is in contact with a hydraulic fluid 204. As shown in FIG. 2, the substrate can be thought of as comprising a plurality of sub-structures 200 having rectangular cross-sections and arranged adjacent to each other at an angle with respect to the hydraulic fluid 204.

At the top surface of the substrate, each sub-structure 200 includes a layer 201 comprising a catalyst. On an exposed side surface between adjacent sub-structures, each sub-structure 200 includes a layer 202 of material which is inert with respect to the catalyst and the reactants. The body of each sub-structure is comprised of a substrate 203, which also acts as a phonon waveguide. Platinum can be used for the catalyst layer 201 and for the substrate 203 with air as the oxidizer, ethanol or methanol as the hydrocarbon reactant fuel and water or mercury as the hydraulic fluid 204. The hydraulic fluid can also serve as a coolant for the device, thereby permitting high power density operation.

The catalyst 201 and substrate 203 may be comprised of the same material, e.g., platinum. Other substrate materials may be used based on structural considerations, manufacturability and/or impedance matching so as to maximize the propagation of the phonon motion into the hydraulic fluid.

The thickness of the platinum catalyst layer 201 and substrate 203 should be less than the energy-changing mean free path of optical branch phonons or high frequency acoustic branch phonons, which is at least of order 10 nanometers and can be as large as one micron.

Nanofabrication methods can be used to form the sawtooth patterns on the surfaces of the substrate 202, with the dimension of a unit of such pattern being as large as 1 micron.

By depositing the inert layers 202 as shown, e.g., on the right-facing facets of the saw-tooth pattern of the top surface, a preferential direction is thereby established for reactions and thus for phonon propagation, as indicated by the arrow in FIG. 2.

Acoustic, ultrasonic or gigahertz acoustic Rayleigh waves on the catalyst side can be used to stimulate the reaction rate and synchronize the emission of phonons. The waves increase the magnitude of the phonon emission and cause coherent emission, greatly enhancing both the peak and average power.

In a further embodiment, a thin layer or layers of material are arranged between the substrate and the fluid. These layers are comprised of materials having acoustic impedances between that of the substrate 202 and the hydraulic fluid 204, so as to maximize the transmission of momentum into the hydraulic fluid and minimize reflections back into the substrate 204. The material should be selected so that the bulk modulus and phonon propagation properties of the material cause the phonons emerging from the substrate to be transmittied substantially into the fluid with minimal reflection and energy loss.

In a further embodiment of a device in accordance with the present invention, the emissions of phonons generated by catalytic reactions are converted into electrical current by piezo-electric effects within materials as the phonons impact the materials. An exemplary embodiment of such a device is shown in FIG. 3.

Figure 3:
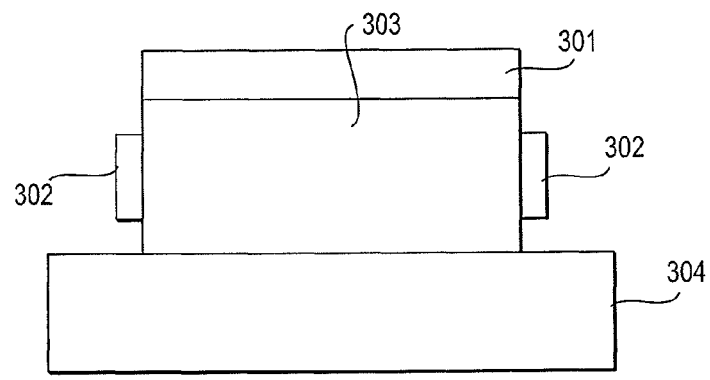
FIG. 3 shows a cross-section of an exemplary embodiment of a device for generating electricity piezoelectrically.

The exemplary device of FIG. 3 comprises a catalyst layer 301 arranged on a piezo-electric element 303, which is in turn arranged on a supporting substrate 304. The catalyst layer 301 can be implemented as a nanocluster, nanolayer or quantum well. Electrical leads 302 are provided at opposite ends of the piezoelectric element 303 across which a potential is developed, in accordance with the present invention. In the exemplary embodiment of FIG. 3, the catalyst layer 301 comprises platinum, with air as the oxidizer and ethanol or methanol as the hydrocarbon reactant fuel. The piezo-electric element 303 can comprise any piezomaterial, including semiconductors that are not normally piezoelectric, such as InGaAsSb. The lattice mismatch between the semiconductor and the platinum produces a strain, commonly called a deformation potential which induces piezoelectric properties in semiconductors, or ferroelectric or piezoelectric materials with a high nonlinearity such as $(Ba, Sr)TiO_3$ thin films, $Al_xGa_{1-x}As/GaAs$ and strained layer InGaAs/GaAs (111)B quantum well p-i-n structures.

Where the piezoelectric element 303 is comprised of a semiconductor, the semiconductor becomes a diode element that converts photons into electricity, collects electrons as electricity, and converts phonons into electricity.

In the exemplary embodiment of FIG. 3, as the reactants interact with the catalytic layer 301, phonons generated by the reactions are conducted into the piezoelectric material 303. As a result, a potential is induced in the piezoelectric material 303 at the electrical contacts 302.

The geometry of the substrate 303 is preferably such as to focus phonons so as to enhance the nonlinearity of the piezoelectric element 303. This results in self-rectification of the high frequency phonons. In an exemplary embodiment, the piezoelectric element 303 is preferably curved and shaped like a lens or concentrating reflector so as to focus the phonons generated by the catalyst on to the piezoelectric material. The focusing of the phonons causes large amplitude atomic motions at the focus. The atomic motions induced by this focusing cause the piezoelectric material to become nonlinear, causing non-linear responses such as the generation of electricity in the material at the focus. This in turn results in the piezomaterial becoming a rectifier of the phonon-induced high frequency current.

Acoustic, ultrasonic or gigahertz acoustic Rayleigh waves can be used on the catalyst side of the exemplary device of FIG. 3 to stimulate the reaction rate and synchronize the emission of phonons, to enhance the magnitude of the phonon emission and to cause coherent emission, greatly enhancing both the peak and average power delivered to the piezoelectric material 303. Acoustic Rayleigh waves accelerate oxidation reactions on platinum catalyst surfaces. Surface acoustic waves can be generated on the surface of the catalyst 301 using a generator (not shown). Such waves may have acoustic, ultrasonic or gigahertz frequencies. The Rayleigh waves induce reactions so as to synchronize the reactions, which in turn synchronizes the emission of phonons. The result is a pulsing bunching of the reactions, which enhances the power delivered to the piezoelectric material 303.

The frequency of operation of the device of FIG. 3 is preferably in the GHz range and lower so that rectification of the alternating currents produced by the piezoelectric material 303 can be achieved with conventional means, such as with semiconductor diodes.

Figure 4:
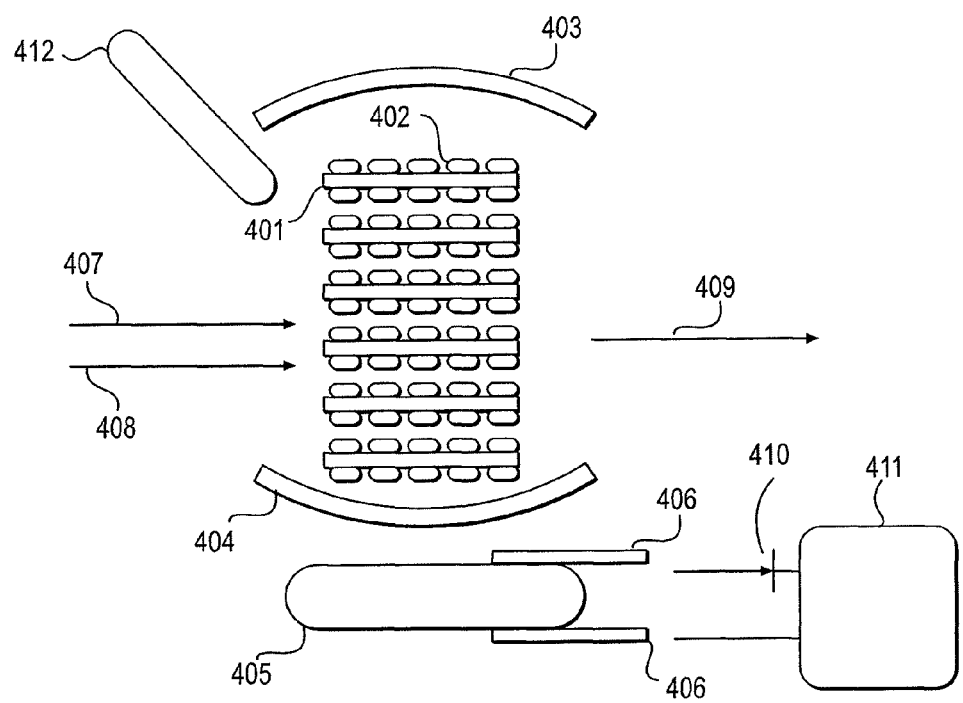
FIG. 4 shows an exemplary embodiment of an arrangement for generating electricity or radiation beams in accordance with the present invention.

In a further exemplary embodiment of the present invention, electromagnetic radiation, such as infrared photons emitted by excited state products such as highly vibrationally excited radicals and final product molecules, is converted into electricity photovoltaically. Stimulated emission of radiation is used to extract the energy from the excited state products, such as highly vibrationally excited radical and reaction product molecules both on the catalyst surface and desorbing from it. The extracted energy appears in the form of a coherent beam or a super-radiant beam of infra-red or optical energy. The frequencies of the radiation correspond to fundamental (vibration quantum number change of 1) or overtones (vibration quantum number change 2 or greater) of the normal mode vibration frequencies of the reactants. Several different frequencies may be extracted simultaneously in this invention. While the resulting coherent beam is useful in its own right, this high intensity beam can also be photovoltaically converted into electricity. In accordance with the present invention, such emissions are created by reactions on catalyst surfaces, and are accelerated by the use of optical cavities. FIG. 4 shows an exemplary embodiment of an electric generator for performing such a conversion.

The device of FIG. 4 comprises one or more substrates 401 upon which a catalyst 402 is arranged in a plurality of islands, nanoclusters, quantum well clusters or quantum dots. The catalyst clusters are sufficiently spaced apart (e.g., tens of nanometers or more) and the substrate is made sufficiently thin (e.g., less than a centimeter total optical thickness), so that IR absorbtion is mitigated at the frequencies of specie emission. The assembly of catalyst clusters on the substrates 401 is substantially transparent to the reaction radiations. The catalyst 402 is preferably platinum or palladium. The device preferably comprises a plurality of substrates 401 stacked so as to permit a volume of reactions.

The catalyst-substrate stack 401/402 is enclosed in an optical cavity having a highly reflective element 403 and a less reflective element 404 arranged as shown in FIG. 4. The optical cavity and the catalyst-substrate stack 401/402 are preferably resonant to the reaction radiations or their overtones. The optical cavity can be used to stimulate overtone radiation, i.e., multipole radiation where the change in quantum number is 2 or more, to increase the energy of the radiation. The optical cavity preferably has multiple frequencies, as in a Fabrey-Perot cavity, that are tuned to overtones of the specie frequencies.

A fuel 407, such as hydrogen, ethanol or methanol and an oxidizer 408, such as air, are introduced into the optical cavity where they interact with the catalyst-substrate stack 401/402. Lean mixtures of fuel can be used so as to minimize resonant transfer, exchange or decay of excited state vibrational energy to other specie of the same chemical makeup in the exhaust stream, during the time these species are in the optical cavity and the photovoltaic converter 405 collects the radiation and converts it into electricity.

A stimulated emission initiator and synchronizer device 412 is used to initiate and synchronize the emissions in the optical cavity. The device 412 can be a commonly available stimulated emission oscillator and can be coupled to the device of the present invention in known ways. The optical cavity can be designed in a known way to create stimulated emission of radiation. A photovoltaic cell is typically not very efficient in converting long wavelength IR photons (1000 to 5000 per centimeter) characteristic of the catalytic reactions. The high peak power output of the device 412 remedies this situation and makes the IR photovoltaic cell more efficient.

A photovoltaic converter 405 is placed outside the volume of the catalyst-substrate stack 401/402 anywhere visible to the emitted radiation. Such a placement allows cooling the photovoltaic collector 405 using known methods. The electrical output leads 406 of the photovoltaic collector 405 can be coupled to an electrical energy storage device 411 via a diode 410. The output of the photovoltaic converter 405 is in pulses with the pulse rate typically being greater than one megahertz. The electrical energy storage device 411 may comprise, for example, a capacitor, super-capacitor or battery. Given the high frequency of the pulsed output, a capacitor used as the storage device 411 can be quite compact. The capacitor need only be large enough to collect the energy of a single pulse. The energy stored in the capacitor can thus be millions of times less than the energy delivered by the converter 405 in one second.

The chemical reactants on the catalyst surface permit overtone transitions because they are part of a "ladder" of transitions and strongly polarized on the catalyst surface, which permits all the transitions to have non-zero dipole radiation transition matrix elements. Also, the reactants have no rotational smearing associated with free molecules in a gas because they are attached to the surface and can not rotate. These features permit a near monochromatic overtone light amplification by stimulated emission of radiation.

The electromagnetic energy radiated by the stimulation of species, as in the embodiment of FIG. 4, can be formed into high brightness, quasi-monochromatic, poly-chromatic radiations or coherent beams.

In each of the above described embodiments which include photovoltaic semiconductors, the catalyst is preferably operated at a high surface power density, e.g., in excess of 10 watts per square centimeter or with a peak surface power density of at least one watt per square centimeter, to enhance the efficiency of the photovoltaic semiconductors.

A diode energy converter, in one embodiment, may be formed with identifiable regions. For example, a region associated with chemical reactions is isolated chemically from the other regions. A region associated with forming a Schottky diode is formed with metals that form energy barriers of the desired height. A region associated with tailoring the boundary between semiconductor material and metal materials is formed so that the junction does not tear apart and so that it forms a reasonably consistent and uniform diode. A region associated with removing heat from the semiconductor provides a substrate that conducts heat as well as support the device. The electric generating device thus formed, in one embodiment, survives physically and mechanically and operates electrically in an environment of heated chemical reactions.

There are many configurations that can satisfy the specifications of these regions. A common element in the region of chemical reactions may include a conducting surface. The vibrationally excited specie contact and interact electronically with the conducting surface. Hot electrons are generated in the conductor as a result of the interaction. On the conducting surface, as part of the surface or near it, one or more catalysts are placed to guide, control or stimulate both the chemical reactions and the location and form of the chemical reaction intermediates. The catalysts may typically be conductors. Typically, the catalysts include conducting metals such as platinum, palladium, gold nanostructures, vanadium and other metals. Catalysts may typically include conducting oxides such as Ru02 (ruthenium oxide). Catalysts may be placed on or next to non-conductors such as titanium oxides or vanadium oxides, where the combinations are also referred to simply as "catalysts."

Associated with the conducting surface is a conductor that isolates the chemical reactions and the associated highly reactive intermediates from the metal or material that forms the Schottky barrier. Since adsorbed hydrogen atoms may typically appear as adsorbed reaction intermediates, a material that acts as a barrier to hydrogen diffusion may be used. Gold provides such a barrier and gold also has a relatively long mean free path for hot electrons. A nanolayer or nanostructure of gold is therefore an example of a material that stops hydrogen and other chemicals from migrating through it and is relatively transparent to hot electrons.

In one embodiment, a common element used when forming a Schottky diode with the desired metal includes an interface between the metal and the semiconductor. The relative surface energy of materials at that interface determines in part whether one will ball up on the other or tear away from the other, or whether it will wet and form a continuous layer on the other. The metal that does not ball up or tear away is often different from one that forms the desired Schottky barrier.

The surface energy condition can be satisfied with a single layer or fractional layer of atoms of a material with the desired surface energy property. When more than one layer is used, then that layer may determine the Schottky barrier properties.

In one embodiment, a common element associated with a supporting substrate is that it conducts heat. The device may typically be immersed in a flow of gas such as a fuel and air mixture. The flow of air may typically be far in excess of what is needed to provide oxygen and may typically be determined by the need to convect or otherwise carry away waste heat.

Figure 5:
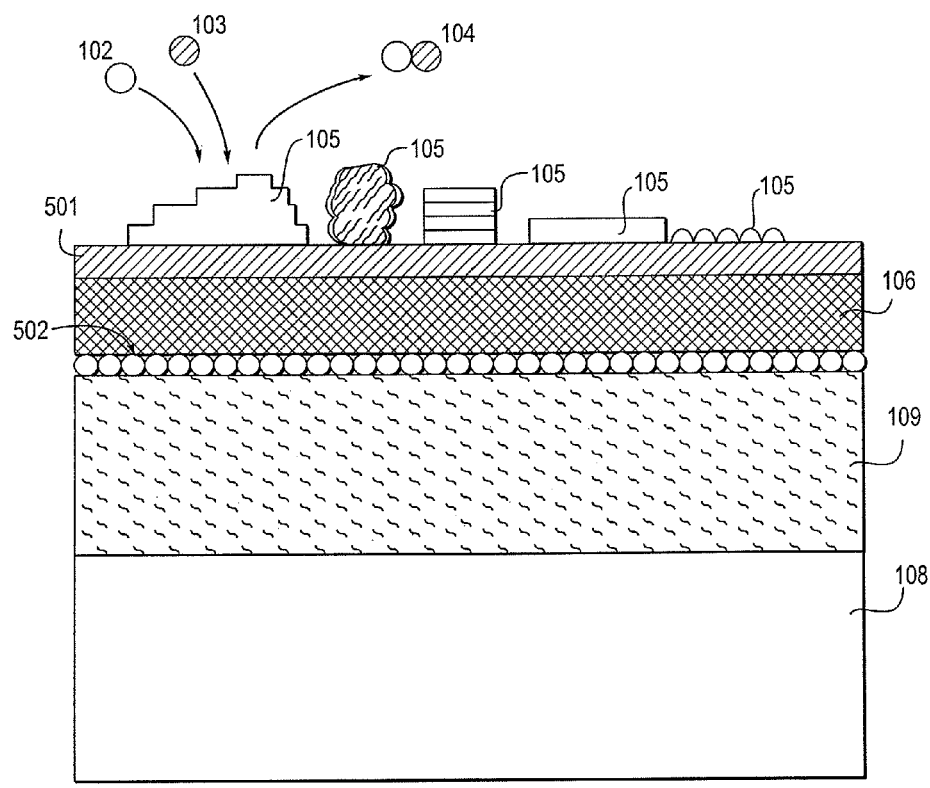
FIG. 5 shows a cross section of multiple nanostructures, semiconductor and substrate of a Schottky diode energy converter in one embodiment.

FIG. 5 shows schematically the cross section of a device addressing the properties of the various regions in one embodiment. The region shown in FIG. 5 associated with reactants such as fuel 102, air oxidizer molecules 103 and exhausts 104 comes in contact with a conducting surface 105 that may include catalysts such as platinum, palladium, Ruthenium, or Ruthenium oxide. The conductor/catalyst may include, but is not limited to, a nanostructure that can be one of a set of stepped monolayers, an irregular shape or clump, a composite clump, regular or irregular monolayers composed of differing materials often referred to as quantum wells, or anyone of many structures, all of which have the common feature that they are a nanolayer, nanocluster, quantum well, or combinations thereof.

In one embodiment, this conducting layer 105 is placed on a stabilizing interlayer conductor 501, which acts as a barrier against chemical transport. The stabilizing interlayer conductor 501 may also be a nanostructure such as nanolayer, nanocluster, quantum well, or combinations thereof.

In one embodiment, the stabilizing interlayer conductor 501 is placed on the Schottky conductor 106, which may also be an interlayer material. The Schottky conductor 106 may also be formed as a nanostructure such as a nanolayer, nanocluster, quantum well, or combinations thereof.

In one embodiment, the Schottky conductor 106 is placed on a tailoring material 502, which may be a monolayer or submonolayer of material. In one embodiment, the tailoring material 502 is chosen to stabilize the mechanical and materials junction between the underlying semiconductor 109 and the Schottky conductor 106.

One or more of the materials chosen for the stabilizing interlayer conductor 501, the Schottky conductor 106 and the tailoring material 502 may under some conditions be formed from the same material. For example, gold (Au) is a good chemical barrier material against hydrogen, hydrocarbon-oxygen reaction intermediates and oxygen, a good electrical conductor, and forms a Schottky barrier on the wide bandgap semiconductor Ti02. Gold is compatible with forming a layer on the semiconductor material Ti02 and with maintaining that layer at temperatures above 100 Celsius.

In one embodiment, the tailoring material 502 is placed on the semiconductor 109 which is in turn formed on a thermally conducting support and substrate 108.

Not shown for clarity are electrodes to the semiconductor 109, and the electrodes to the conductors IOS, 501, 106, 502. The electrodes to the conductors IOS, SOI, 106, 502 can be made to one or more of these conductors as convenience permits. The electrodes to the semiconductor 109 can be similarly made to convenience.

In one embodiment, the thermal conductivity of the substrate 108 and semiconductor 109 typically removes heat from conductors IOS, 501, 106, 502 at such a high rate that nanometer thick conductors may safely carry orders of magnitude more current than isolated conductors such as wires of the same thickness.

The principles associated with optimizing a Schottky converter are general and apply to a pn junction converter as well.

Figure 6:
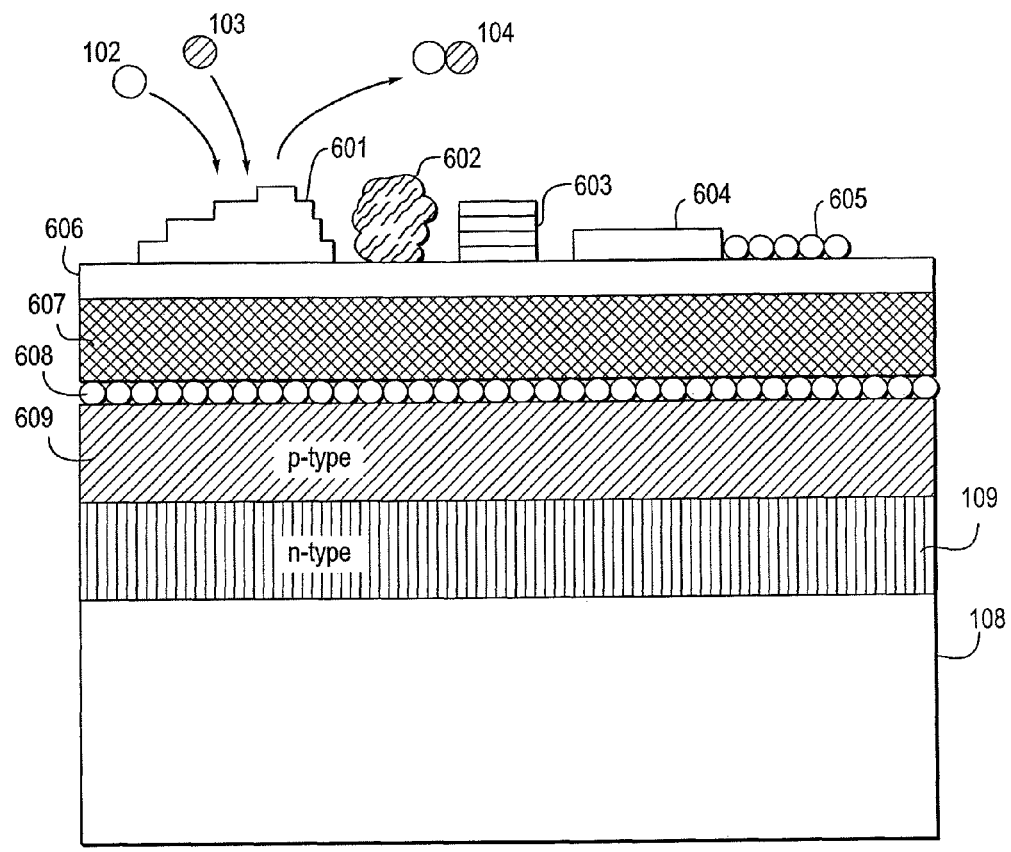
FIG. 6 shows a cross section of multiple nanostructures, a semiconductor and substrate of a pn junction diode energy converter in one embodiment.

FIG. 6 shows a cross section of an example of the method applied to forming a pn junction energy converter. The region associated with reactants such as fuel 102, air oxidizer molecules 103 and exhausts 104 comes in contact with a conductor/catalyst 601 through 605 and 606 that may include catalysts such as platinum, palladium or Ruthenium oxide.

The conductor/catalyst may include, but is not limited to, a conducting nanostructure that may include one or more of a set of stepped monolayers 601, an irregular shape or clump 602, a composite clump 602, regular or irregular monolayers composed of differing materials often referred to as quantum wells 603, or anyone of many structures 604 and 605, all of which have the common feature that they are a nanolayer, nanocluster, quantum well, or combinations thereof.

In one embodiment, this conductor/catalyst 601, 602, 603, 604, 605 is placed on a stabilizing interlayer conductor 606 which acts as a barrier against chemical transport. The stabilizing interlayer conductor 606 is also a nanostructure such as a nanolayer, nanocluster, quantum well, or combinations thereof, in one embodiment.

In one embodiment, the stabilizing interlayer conductor 606 is placed on an ohmic contact material 607. The ohmic contact material 607 is also formed as a nanostructure such as a nanolayer, nanocluster, quantum well, or combinations thereof, in one embodiment.

The tailoring material 608 and ohmic contact material 607 make a stable ohmic contact to the semiconductor 609, shown as a p-type semiconductor. The tailoring material 608 is chosen to tailor the physical properties of the junction between ohmic contact material 607 and semiconductor material 609.

Hot electrons with energy greater than the band gap of the semiconductor 109 and generated in the conductor/catalyst elements 601, 602, 603, 604, 605 and 606 are transported though elements 607, 608 and into the conduction band of the p-type semiconductor, become minority carriers. The junction of the p-type semiconductor 609 and n-type semiconductor 109 provides an electric field that draws the minority carriers from the p-type semiconductor 609 conduction band to the n-type semiconductor conduction band. The hot electrons have thereby been converted first into minority carriers and then into majority carriers. The method shown produces a useful electric potential and forward bias across the pn junction.

A person of ordinary skill in the art will appreciate that it is common practice to heavily dope one or both semiconductor elements and to vary the composition of the semiconductors over dimension. Accordingly, the semiconductors disclosed in this application may be doped or heavily doped, and varied in composition over dimension as desired.

Not shown for clarity are the electrodes to the semiconductor and metal elements.

We claim:

1. An energy converter that converts vibrational energy of a vibrationally energized species into a useful form of energy, comprising:
    a substrate;
    a first semiconductor layer on the substrate;
    a second semiconductor layer on the first semiconductor layer, the first semiconductor layer and the second semiconductor layer forming a p-n junction;
    a tailoring layer on the second semiconductor layer, the tailoring layer comprising one or more ballistic charge carrier materials;
    an ohmic contact conductor on the tailoring layer, the ohmic contact conductor material comprising one or more ballistic charge carrier materials, wherein the tailoring layer and the ohmic contact make a stable ohmic contact to the second semiconductor layer;

a stabilizing interlayer conductor on the ohmic contact conductor material, the stabilizing interlayer conductor physically isolating chemical reactants from the semiconductor layer and acting as a barrier against chemical transport, the stabilizing interlayer conductor comprising one or more ballistic charge carrier materials; and a conducting catalyst surface on the stabilizing interlayer conductor, the conducting surface being formed from one or more nanostructures in contact with a region having at least some vibrationally energized species.

2. The energy converter of claim 1, wherein the tailoring layer comprises a material having a surface energy that approximately matches the surface energy of the second semiconductor.

3. The energy converter of claim 1, wherein the conducting surface has a thickness sufficiently small to render the total thickness to be relatively transparent relative to the ballistic transport of hot electrons through the conductors.

4. The energy converter of claim 1, wherein the total dimension of all layers is up to 200 monolayers.

5. The energy converter of claim 1, wherein the conducting surface is formed such that vibrationally energized species generated on or near the conducting surface transfer a fraction of its vibrational energy to ballistic electrons in the conducting surface when the vibrationally energized species contacts the conducting surface.

6. The energy converter of claim 5, wherein kinetic energy of ballistic electrons are converted into a useful diode forward bias voltage in the semiconductor formed into the p-n junction.

7. The energy converter of claim 1, wherein the stabilizing interlayer conducting surface is comprised of materials that block the passage of reactants and reaction products from reacting with or diffusing through the ohmic contact conductor material.

8. The energy converter of claim 1 wherein the substrate has at least a portion thereof in thermal contact with the flow of the chemical reactants.

9. The energy converter of claim 1, wherein the substrate is formed from a heat conducting material.

10. The energy converter of claim 1 wherein the substrate comprises a thermally conductive layer.

11. An energy converter for converting vibrational energy of a vibrationally energized species into a useful form of energy, comprising:

a substrate;

a semiconductor layer on the substrate;

a tailoring layer on the semiconductor layer, wherein the tailoring layer comprises one or more ballistic charge carrier materials;

a Schottky conductor on the tailoring layer, wherein the Schottky conductor comprises one or more ballistic charge carrier materials, wherein the tailoring layer is disposed between the Schottky conductor and the semiconductor layer, and wherein the Schottky conductor and the semiconductor layer form a Schottky diode;

a stabilizing interlayer conducting surface comprised of one or more conductors and conducting catalysts on the Schottky conductor, wherein the stabilizing interlayer conducting surface physically isolates chemical reactants from the semiconductor layer and acts as a barrier against chemical transport, the stabilizing interlayer conducting surface comprising one or more ballistic charge carrier materials;

a conducting catalyst surface on the stabilizing interlayer conductor, the conducting surface being formed from one or more nanostructures in contact with a region having at least some vibrationally energized species; and wherein the tailoring layer stabilizes mechanical and materials junctions between the Schottky conductor and the semiconductor layer, thereby preventing tearing of the Schottky conductor from the semiconductor layer.

12. The energy converter of claim 11, wherein the tailoring layer, the stabilizing interlayer conducting surface, the Schottky conductor and the conducting catalyst surface combined have a thickness sufficiently small to render the total thickness to be relatively transparent relative to the ballistic transport of hot electrons therethrough.

13. The energy converter of claim 11, wherein all layers have a thickness up to 200 monolayers.

14. The energy converter of claim 11, wherein the stabilizing interlayer conducting surface is formed such that vibrationally energized species generated on or near the stabilizing interlayer conducting surface transfer a fraction of its vibrational energy to ballistic electrons in the conducting surface when the vibrationally energized species contacts the stabilizing interlayer conducting surface.

15. The stabilizing interlayer of claim 14, wherein ballistic electrons have kinetic energy that is converted into a useful diode forward bias voltage in the Schottky diode.

16. The energy converter of claim 11 wherein the stabilizing interlayer conducting surface comprises materials that block the passage of reactants and reaction products from reacting with or diffusing through the Schottky conductor.

17. The energy converter of claim 11 wherein the tailoring material is comprised of materials having a surface energy that approximately matches the surface energy of the semiconductor layer.

18. The energy converter of claim 11 wherein the substrate has at least a portion thereof in thermal contact with the flow of the chemical reactants.

19. The energy converter of claim 11 wherein the substrate is formed from a heat conducting material.

20. The energy converter of claim 11 wherein the substrate is thermally conductive.

* * * * *